United States Patent [19]

Fukutomi et al.

[11] Patent Number: 5,359,785
[45] Date of Patent: Nov. 1, 1994

[54] SUBSTRATE TRANSPORT APPARATUS

[75] Inventors: Yoshiteru Fukutomi; Masami Ohtani; Takeo Okamoto, all of Kyoto, Japan

[73] Assignee: Dainippon Screen Mfg. Co., Ltd., Kyoto, Japan

[21] Appl. No.: 977,990

[22] Filed: Nov. 18, 1992

[30] Foreign Application Priority Data

Nov. 26, 1991 [JP] Japan .................................. 3-337802

[51] Int. Cl.⁵ ............................................ F26B 19/00
[52] U.S. Cl. ..................................... 34/60; 414/292; 134/85
[58] Field of Search ............................ 406/72, 79, 86; 271/597, 195; 414/217, 292; 34/60; 134/61, 85

[56] References Cited

U.S. PATENT DOCUMENTS 4,556,362 12/1985 Bahnck et al. .

FOREIGN PATENT DOCUMENTS

0253162A3 1/1988 European Pat. Off. .
0385590A1 9/1990 European Pat. Off. .
4-30549 2/1992 Japan .

Primary Examiner—Henry A. Bennet
Attorney, Agent, or Firm—Lowe, Price, LeBlanc & Becker

[57] ABSTRACT

A deck movable between cassettes arranged on a base for storing a plurality of substrates in multiple stages and a substrate cleaning section for cleaning the substrates, supports a substrate fetching arm for fetching the substrates from the cassettes, and a cleaned substrate depositing arm for depositing treated substrates. The depositing arm is vertically movable between a position in which a substrate supporting surface thereof is situated below a substrate supporting surface of the substrate fetching arm to render the latter operative, and a position in which the supporting surface of the depositing arm is situated above the supporting surface of the fetching arm to render the depositing arm operative.

18 Claims, 11 Drawing Sheets

SUBSTRATE TRANSPORT APPARATUS

BACKGROUND OF THE INVENTION

(1) Field of the Invention

The present invention relates to a substrate transport apparatus for fetching substrates, one at a time, from cassettes storing the substrates, such as semiconductor wafers or glass substrates for liquid crystal displays, in multiple stages, transporting the fetched substrates to a substrate cleaning section for cleaning with pure water or the like, and transporting cleaned substrates back into the cassettes. The apparatus supports the substrates by vacuum suction during the transport between the cassettes arranged on a base for storing the substrates in multiple stages, and the substrate cleaning section for cleaning the substrates. The substrates are fetched from the cassettes, transported to the substrate cleaning section, and transported back into the cassettes after a cleaning treatment in the substrate cleaning section.

(2) Related Art Statement

Preferably, the substrates are stored in each cassette with a narrow vertical space between adjacent substrates so that the cassette may hold a large number of substrates. It is difficult for a substrate transport apparatus as noted above to employ a pin-support type substrate holding device for entering such a narrow space and supporting each substrate through point contacts. Generally, therefore, a substrate transport device having a thin, vacuum type suction arm is used for transporting the substrates into and out of the cassettes. The suction arm is moved to a position under one of the substrates stored in multiple stages in one of the cassettes. The substrate is placed on and drawn by vacuum suction to an upper surface of the suction arm. The substrate is brought out of the cassette in this state, and transferred to a pin-support type position adjusting mechanism waiting at a standby position. After a position adjustment, the substrate is delivered to an edge-holding type substrate transport device for processing. This process substrate transport device transports the substrate to the cleaning section. After a cleaning treatment, the substrate is transported by the process transport device and delivered to the position adjusting mechanism. After a position adjustment, the cleaned substrate is transported by the cassette-side transport device to a position opposed to a selected one of the cassettes, and then deposited in that cassette. (see Japanese Patent Application No. 2-137490)

With the conventional substrate transport apparatus, however, the same suction arm that carries substrates yet to be cleaned in fetching them from the cassettes is used also for depositing cleaned substrates in the cassettes. When the substrates are fetched from the cassettes, particles adhering to lower surfaces of the substrates are transferred to a supporting surface of the suction arm. Since the same suction arm is used to deposit cleaned substrates in the cassettes, lower surfaces of the cleaned substrates become recontaminated to deteriorate product quality.

Only a low yield is secured particularly where such a substrate transport apparatus is used in the type of substrate cleaning machine that cleans both upper and lower surfaces of substrates. Thus, improvement has been desired.

SUMMARY OF THE INVENTION

An object of the present invention is to provide an improvement to avoid recontamination of cleaned substrates being deposited in cassettes.

Another object of the invention is to provide a simplified transport apparatus capable of avoiding such recontamination.

A further object of the invention is to provide a simple and compact transport apparatus capable of avoiding such recontamination.

The above objects are fulfilled, according to the present invention, by a substrate transport apparatus comprising means for storing a plurality of substrates, means for cleaning the substrates, means for taking out the substrates from the storing means and for transporting the substrates to the cleaning means while supporting the substrates by vacuum suction, and means for transporting the substrates cleaned by the cleaning means to the storing means while supporting the substrates by vacuum suction and for placing the substrates in the storing means.

In the substrate transport apparatus according to the present invention, the substrates are fetched from the storing means by the taking-out and transporting means, whereas the cleaned substrates are deposited in the storing means by the transporting and placing means.

Thus, according to this substrate transport apparatus, the transport device that fetches the substrates from the storing means is not used to deposit the cleaned substrates in the storing means. This construction positively avoids recontamination of the substrates to assure an improved quality of treated substrates.

In another aspect of the invention, there is provided a substrate transport apparatus comprising means for storing a plurality of substrates, means for cleaning the substrates, a movable member movable between the storing means and the cleaning means, a taking-out and transporting mechanism, mounted on the movable member, for taking out the substrates from the storing means and for transporting the substrates to the cleaning means while supporting the substrates by vacuum suction, and a transporting and placing mechanism, mounted on the movable member, for transporting the substrates cleaned by the cleaning means from the cleaning means to the storing means while supporting the substrates by vacuum suction and for placing the substrates in the storing means.

According to this substrate transport apparatus, the taking-out and transporting mechanism fetches the substrates from the storing means, and the transporting and placing mechanism deposits the cleaned substrates in the storing means, both by moving the same movable member.

In the above substrate transport apparatus, the taking-out and transporting mechanism and the transporting and placing mechanism are mounted on the same movable member. The single moving construction is used both for fetching the substrates from the storing means and for depositing the substrates in the storing means. Compared with use of separate movable member, this moving construction is simple and yet capable of avoiding recontamination of the substrates.

In a further aspect of the invention, there is provided a substrate transport apparatus comprising means for storing a plurality of substrates, means for cleaning the substrates, a movable member movable between the storing means and the cleaning means, a taking-out and transporting arm, mounted on the movable member and comprising a first surface having a suction hole, for taking out the substrates from the storing means and for transporting the substrates to the cleaning means while supporting the substrates by vacuum suction, a transporting and placing arm, mounted on the movable member and comprising a second surface having a suction hole, for transporting the substrates cleaned by the cleaning means from the cleaning means to the storing means while supporting the substrates by vacuum suction and for placing the substrates in the storing means, and a driving mechanism for driving at least one of the taking-out and transporting arm and the transporting and placing arm to move vertically relative to each other.

According to this substrate transport apparatus, the same movable member is moved between the storing means and the cleaning means. In addition to this movement, the supporting surface of the taking-out and transporting arm may be situated above that of the transporting and placing arm when fetching the substrates. Consequently, the lower surfaces of substrates yet to be cleaned are maintained out of contact with the supporting surface of the transporting and placing arm. The taking-out and transporting arm fetches the substrates yet to be cleaned from the storing means without contaminating the supporting surface of the transporting and placing arm.

On the other hand, when depositing the cleaned substrates in the storing means, the movable member is moved with the supporting surface of the transporting and placing arm situated above that of the taking-out and transporting arm. Consequently, the lower surfaces of cleaned substrates are maintained out of contact with the supporting surface of the taking-out and transporting arm. The transporting and placing arm deposits the cleaned substrates in the storing means without contaminating the cleaned substrates.

Thus, in the above substrate transport apparatus, the taking-out and transporting arm and transporting and placing arm are mounted on the same movable deck. The single moving construction is used both for fetching the substrates from the storing means and for depositing the substrates in the storing means. Moreover, the supporting surfaces of the two arms are vertically movable relative to each other to selectively carry out the substrate fetching and depositing operations. This involves only a slight variation in the vertical relationship between the two supporting surfaces. Such a simple and compact transport construction effectively avoids recontamination.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

FIGS. 1 through 17 show embodiments of the present invention, in which:

FIG. 1 is a perspective view showing an outline of a semiconductor manufacturing machine employing a substrate transport apparatus in a first embodiment;

FIG. 2 is an exploded perspective view of the substrate transport apparatus;

FIG. 3 is a rear view of a principal portion of the substrate transport apparatus;

FIG. 4 is a plan view of the principal portion;

FIG. 5 is a side view, partly in section, of an arm support structure;

FIG. 6 is a plan view of arms;

FIGS. 7 (a) and (b) are sectional views of the arms;

FIG. 8 is a side view of an arm support structure in a second embodiemnt;

FIG. 9 is a plan view of an arm in the second embodiment;

FIG. 11 is a perspective view of a principal portion of a third embodiment;

FIG. 12 is a fragmentary side view, partly in section, of a principal portion of a fourth embodiment;

FIG. 13 is a view seen in the direction of arrows 1—1 of FIG. 12;

FIG. 14 is a fragmentary side view, partly in section, of a principal portion of a fifth embodiment;

FIG. 15 is a fragmentary side view, partly in section, of a principal portion of a sixth embodiment;

FIG. 16 is a view seen in the direction of arrows 2—2 of FIG. 15; and

FIG. 17 is a perspective view showing an outline of a semiconductor cleaning machine employing a substrate transport apparatus in a seventh embodiment.

DETAILED DESCRIPTION OF THE PREFERRED EMBODIMENTS

Embodiments of the present invention will be described in detail hereinafter with reference to the drawings.

<First Embodiment>

Figure 1:
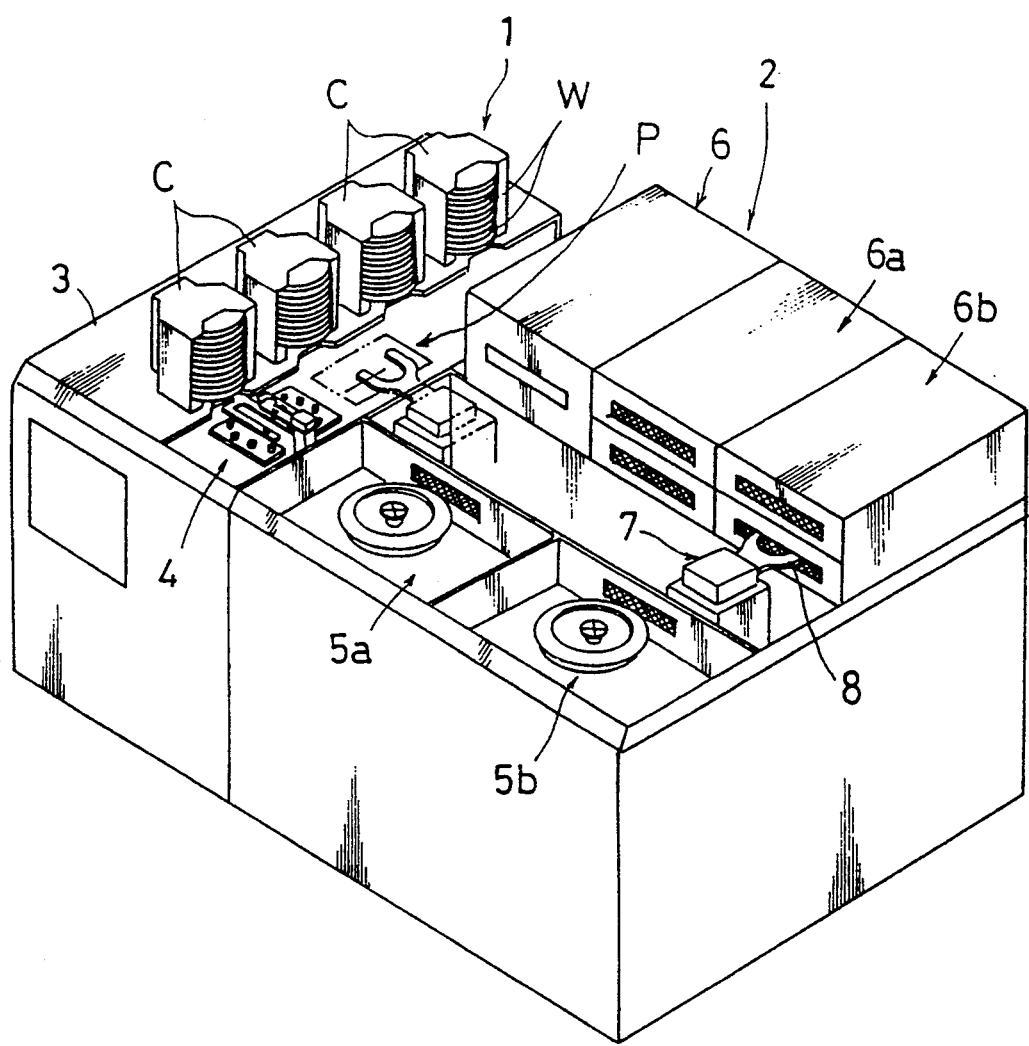

FIG. 1 is a perspective view showing an outline of a substrate cleaning machine employing a substrate transport apparatus in a first embodiment of the invention.

This substrate cleaning machine is used for cleaning and drying both upper and lower surfaces of semiconductor substrates such as silicon wafers W. Broadly, the machine has a section (hereinafter referred to as an indexer module) 1 for storing cleaned wafers and wafers yet to be cleaned, and a wafer cleaning section 2 for cleaning the wafers W.

The indexer module 1 includes four cassettes C arranged in a row on a stationary base 3, and an indexer transport unit 4 for transporting the wafers W between the cassettes C and a predetermined wafer transfer position P.

Each cassette C is constructed to store the wafers W stacked in multiple stages.

The wafer cleaning section 2 includes spinner units 5a and 5b for cleaning both upper and lower surfaces of the wafers W with pure water supplied thereto and cleaning brushes (not shown) and for spin-drying the wafers W, a wafer reversal unit 6 for turning over the wafers W, heating units 6a and 6b for evaporating water molecules from the surfaces of spin-dried wafers W, and a process transport unit 7 for transporting the wafers W among the predetermined transfer position P and the units 5a, 5b, 6a and 6b.

The process transport unit 7 includes a U-shaped wafer support arm 8 for supporting peripheral edges of the wafers W. This support arm 8 is swivelable about a vertical axis.

Figure 2:
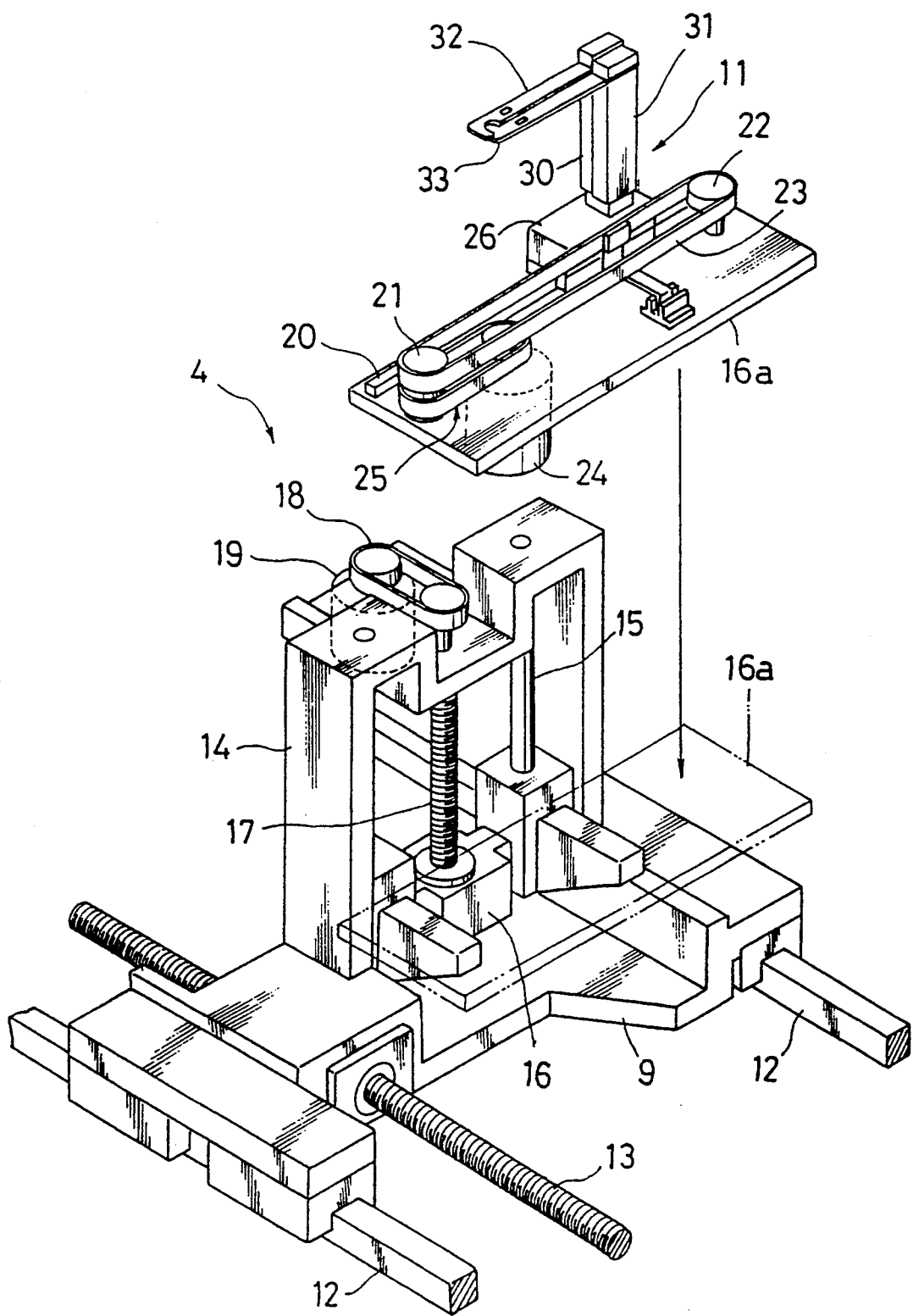
Figure 3:
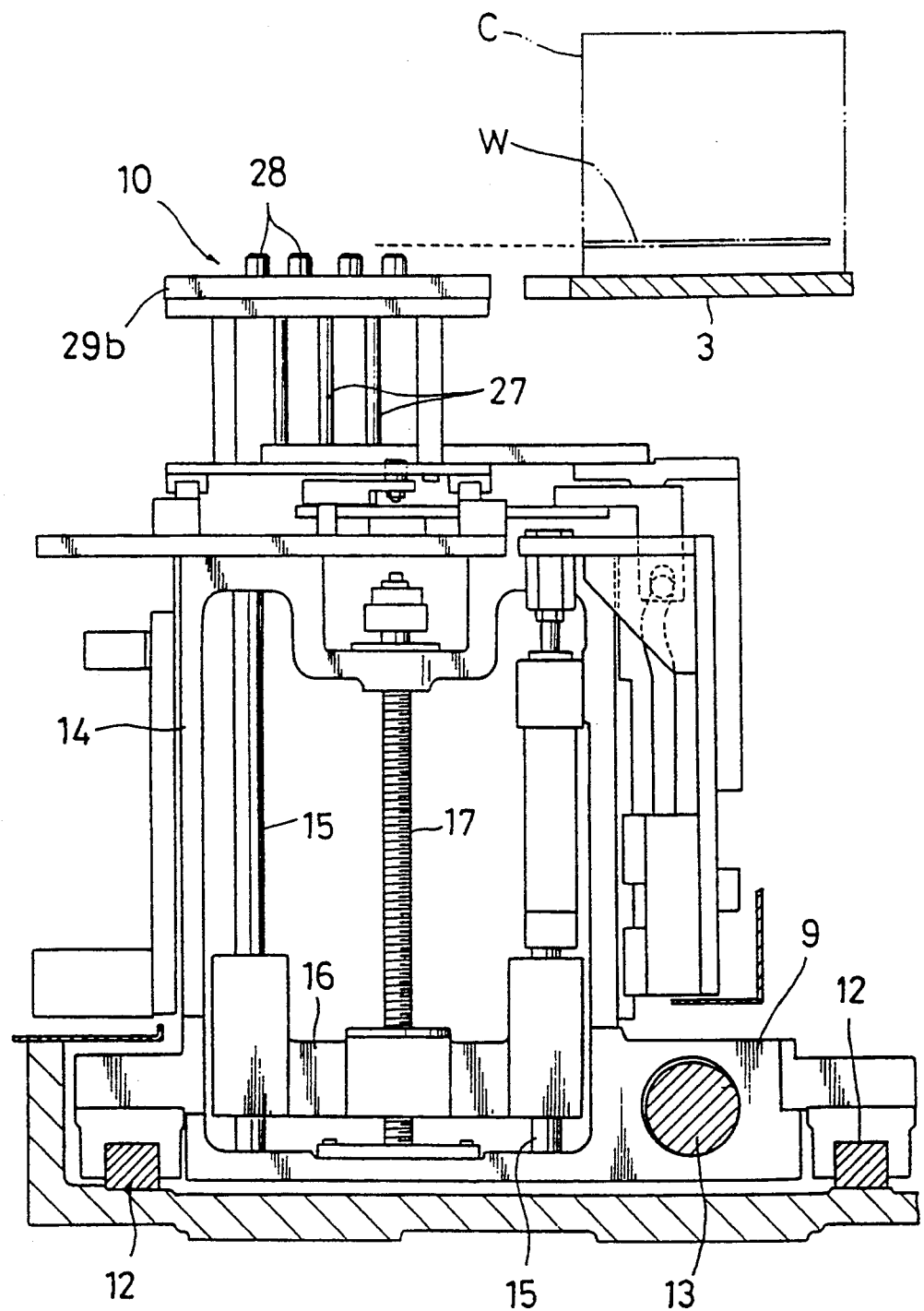
Figure 4:
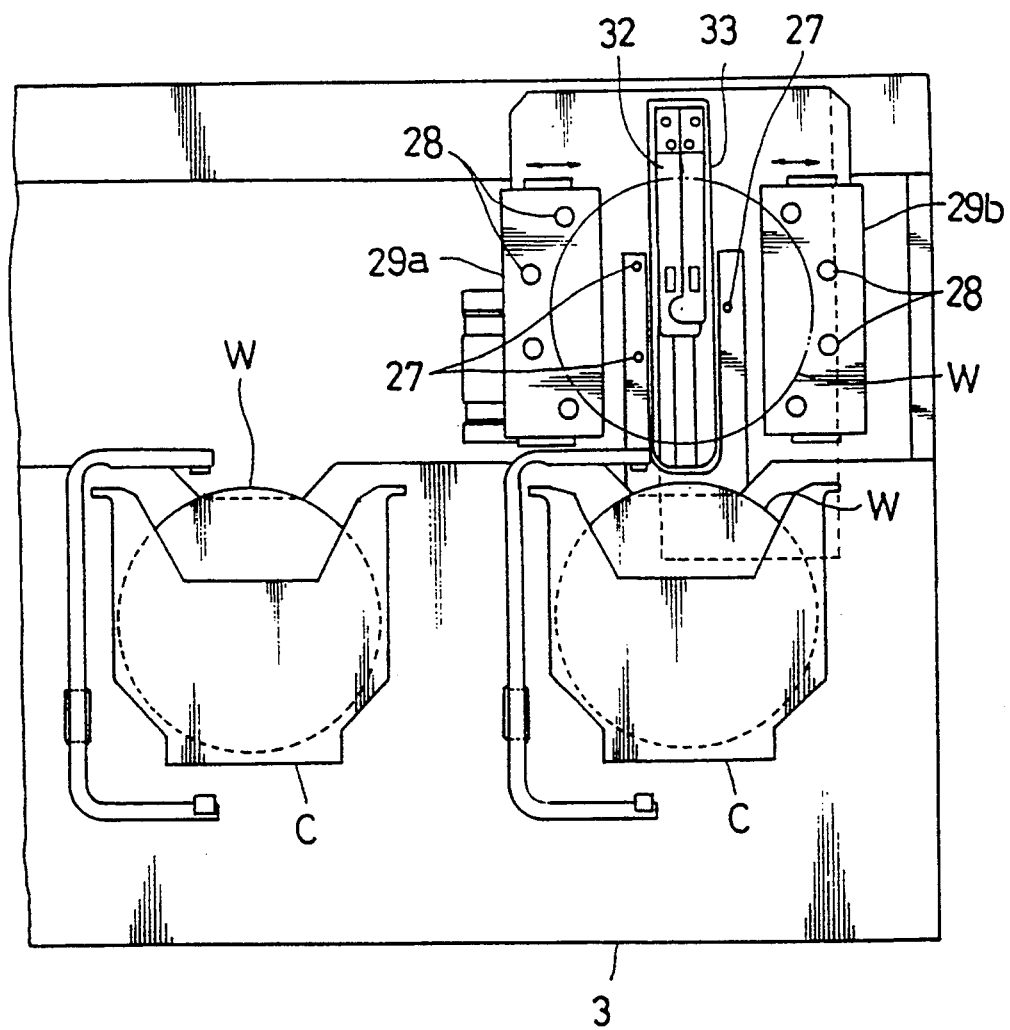

Details of the indexer transport unit 4 are shown in FIG. 2 which is an exploded perspective view, FIG. 3 which is a rear view, and FIG. 4 which is a plan view. This transport unit 4 includes support deck 9 supporting a position adjusting mechanism 10, and a vacuum suction type wafer transport apparatus 11 according to the present invention.

The support deck 9 is fitted on a pair of first guides 12 extending parallel to the row of cassettes C, and meshed with a first screw shaft 13 rotatable by a reversible electric motor (not shown). Thus, the support deck 9 may be driven to and fro along the row of cassettes C and stopped at a position opposed to a selected one of the cassettes C and at the wafer transfer position P.

The support deck 9 has a gate-shaped frame 14, and a pair of second guides 15 attached to the gate-shaped frame 14. A vertically movable support block 16 is fitted on the second guides 15, and meshed with a second screw shaft 17. The second screw shaft 17 has an upper end thereof operatively connected through a first transmission belt 18 to a first reversible electric motor 19. Thus, the block 16 may be driven vertically while facing a selected one of the cassettes C.

The vertically movable block 16 has a lift deck 16a secured thereto and supporting a third guide 20 extending horizontally and parallel to the row of cassettes C. The lift deck 16a further supports a first pulley 21 and a second pulley 22 with a belt 23 wound therearound. The first pulley 21 is operatively connected to a second reversible electric motor 24 through a second transmission belt 25. A movable deck 26 is rigidly attached to the belt 23 and fitted on the third guide 20. The movable deck 26 supports a wafer fetch arm 32 and a cleaned wafer deposit arm 33, which will be described later, to be movable toward and away from the cassettes C to fetch the wafers W from the cassettes C or deposit the wafers W therein.

The position adjusting mechanism 10 includes three support pins 27 movable upward to contact and support a lower surface of a wafer W, and eight projections 28 for contacting outer peripheries of the wafer W to adjust its position. Four of the projections 28 are provided on a first adjusting plate 29a, while the remaining four are provided on a second adjusting plate 29b. The first adjusting plate 29a and second adjusting plate 29b are movable toward and away from each other synchronously with vertical movement of the support pins 27. After a wafer W is passed from the wafer fetch arm 32 onto the support pins 27, or before a cleaned wafer W is passed from the support pins 27 onto the wafer deposit arm 33, the first and second adjusting plates 29a and 29b are lowered to an appropriate level and then moved toward each other to bring the projections 28 into contact with peripheries of the wafer W, thereby to maintain the wafer W in a predetermined position.

Figure 5:
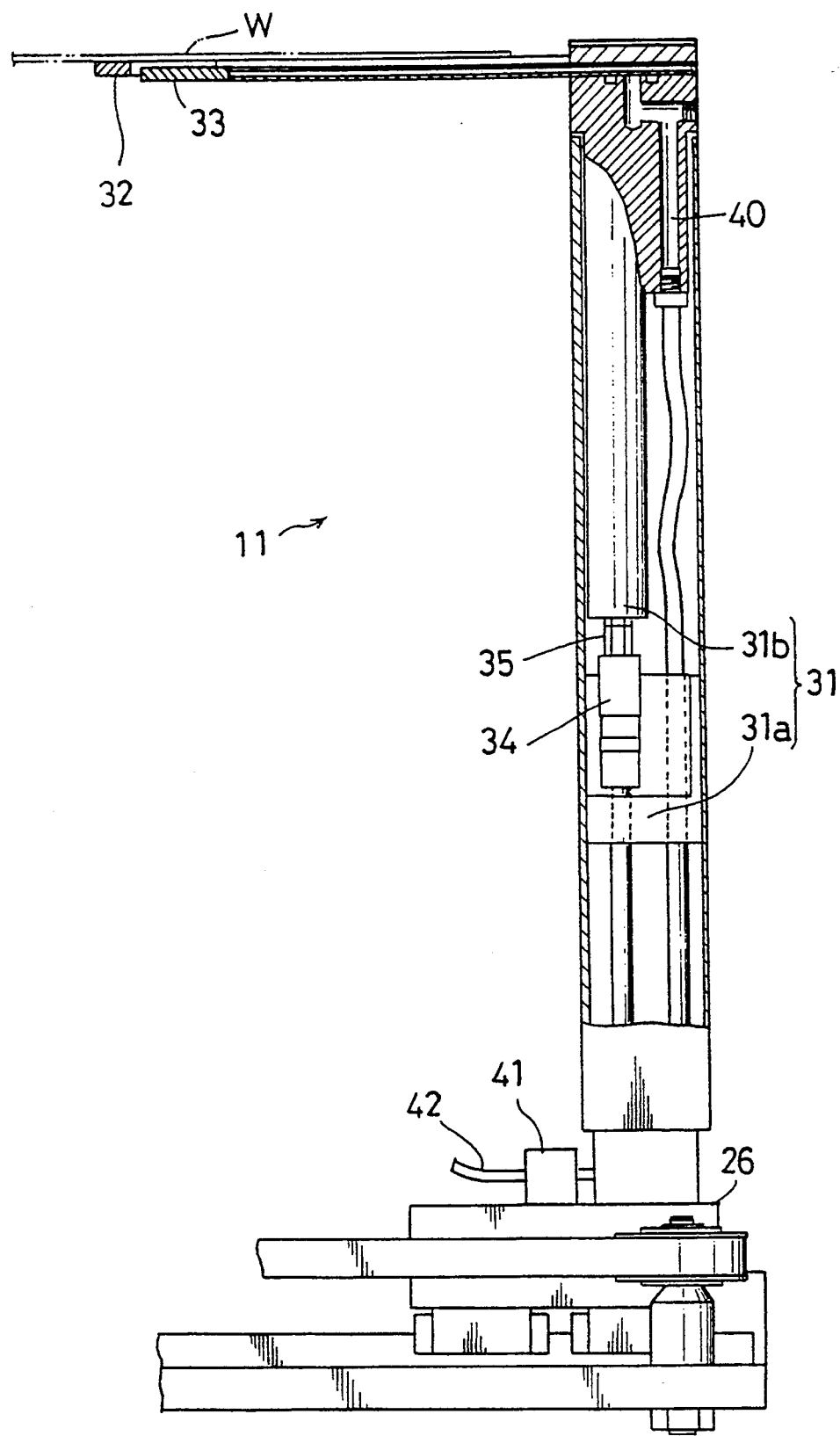

A support structure for the wafer fetch arm 32 and cleaned wafer deposit arm 33 is shown in FIG. 2 which is an exploded perspective view as noted hereinbefore, and in FIG. 5 which is a side view. As seen, the movable deck 26 has a first supporting post 30 and a second supporting post 31 erected thereon. The wafer fetch arm 32 formed as a thin, hollow arm is rigidly connected to an upper end of the first supporting post 30. Similarly, the wafer deposit arm 33 formed as a thin, hollow arm is rigidly connected to an upper end of the second supporting post 31.

The second supporting post 31 has a two-part construction including a lower post 31a secured to the movable deck 26, and a vertically movable upper post 31b. A single-acting air cylinder 34 is interposed between the upper post 31a and lower post 31b. When air is exhausted from the air cylinder 34, a wafer supporting surface of the cleaned wafer deposit arm 33 is retracted to an inoperative position below (e.g. about 0.5 mm below) a wafer supporting surface of the wafer fetch arm 32. When air is supplied into the air cylinder 34, the supporting surface of the cleaned wafer deposit arm 33 is raised to an operative position above (e.g. about 0.5 mm above) the supporting surface of the wafer fetch arm 32.

Reference numeral 35 in FIG. 5 denotes a stopper for contacting the upper post 31b to define a lower limit of its vertical movement. An upper limit of the vertical movement is provided by a stroke end of the air cylinder 34.

Figure 6:
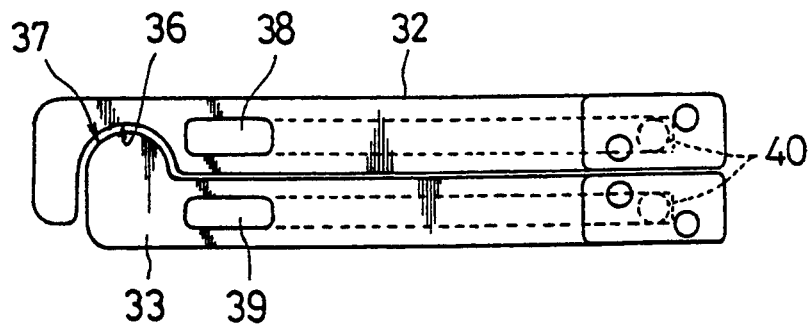

As shown in plan in FIG. 6, the supporting surface of the wafer fetch arm 32 includes a recess 36 formed in a distal region thereof, while the supporting surface of the cleaned wafer deposit arm 33 includes a bulge 37 formed in a distal region thereof to fit into the recess 36. Thus, the two arms 32 and 33 provide an equal area for supporting wafers W, and support the wafers W adjacent the center thereof.

The wafer fetch arm 32 and cleaned wafer deposit arm 33 include suction holes 38 and 39 formed in intermediate positions of the supporting surfaces, respectively. The suction holes 38 and 39 are connected to a compressor, not shown, through air ducts 40 formed in the first and second supporting posts 30 and 31, respectively, a control valve 41 and an air pipe 42. The control valve 41 is switchable with extension and contraction of the air cylinder 34, whereby air is drawn through the suction hole 38 or 39 of only one of the arms 32 or 33 that has the wafer supporting surface situated above that of the other.

Figure 7A:
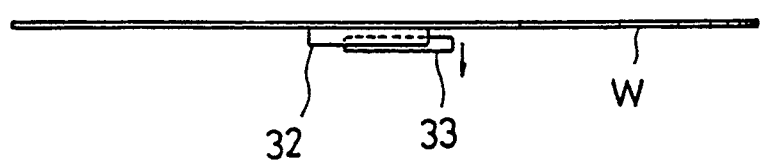

When fetching a wafer W yet to be cleaned from one of the cassettes C with the above construction, the support deck 9 is moved to and stopped at a position opposed to that cassette C, and the lift deck 16 is raised to locate the two arms 32 and 33 slightly below the target wafer W. Then, as shown in section in FIG. 7(a), the cleaned wafer deposit arm 33 is lowered so that the supporting surface of the wafer fetch arm 32 is situated above that of the cleaned wafer deposit arm 33. In this state, the movable deck 26 is moved toward the cassette C to insert the arms 32 and 33 into the cassette C, and the lift deck 16a is raised slightly to pick up the wafer W inside the cassette C. The wafer W is then suction-supported on the supporting surface of the wafer fetch arm 32. The movable deck 26 is thereafter moved horizontally away from the cassette C, with the arm 32 carrying the wafer W out of the cassette C.

Subsequently, the lift deck 16a is lowered to pass the wafer W on to the support pins 27. The support pins 27 are lowered to a predetermined level, and the position adjusting mechanism 10 is operated for positional adjustment. Then the support deck 9 is moved to the wafer transfer position P, and the support pins 27 are raised to a predetermined level to transfer the wafer W to the process transport unit 7. In the wafer cleaning section 2, both upper and lower surfaces of the wafer W are cleaned and dried.

Figure 7B:
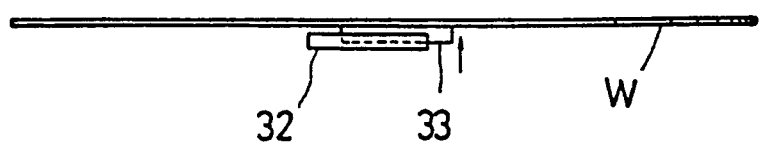

The cleaned wafer W is transported by the process transport unit 7 to the wafer transfer position P where the wafer W is transferred to the support pins 27. After a positional adjustment is carried out by the adjusting mechanism 10 with the support pins 27 lowered to the predetermined level, the support deck 9 is moved to a position opposed to a selected one of the cassettes C. Then, the lift deck 16a is raised with the supporting surface of the cleaned wafer deposit arm 33 situated above that of the wafer fetch arm 32 as shown in section in FIG. 7(b). Consequently, the cleaned wafer W is raised to a predetermined level as suctionsupported on the supporting surface of the cleaned wafer deposit arm 33. The movable deck 26 is moved toward the cassette C to insert the arms 32 and 33 into the cassette C. Once the wafer W reaches an appropriate position, the lift deck 16a is lowered and the wafer W is released from the suction support to rest in the cassette C. The movable deck 26 is thereafter moved away from the cassette C with no suction applied to the wafer W, to complete placement of the wafer W in the cassette C. Through the above steps, the cleaned wafer W is transported to and stored in the cassette C without contaminating the wafer W with particles which were adhering to the lower surface of the wafer W before the cleaning treatment.

<Second Embodiment>

Figure 8:
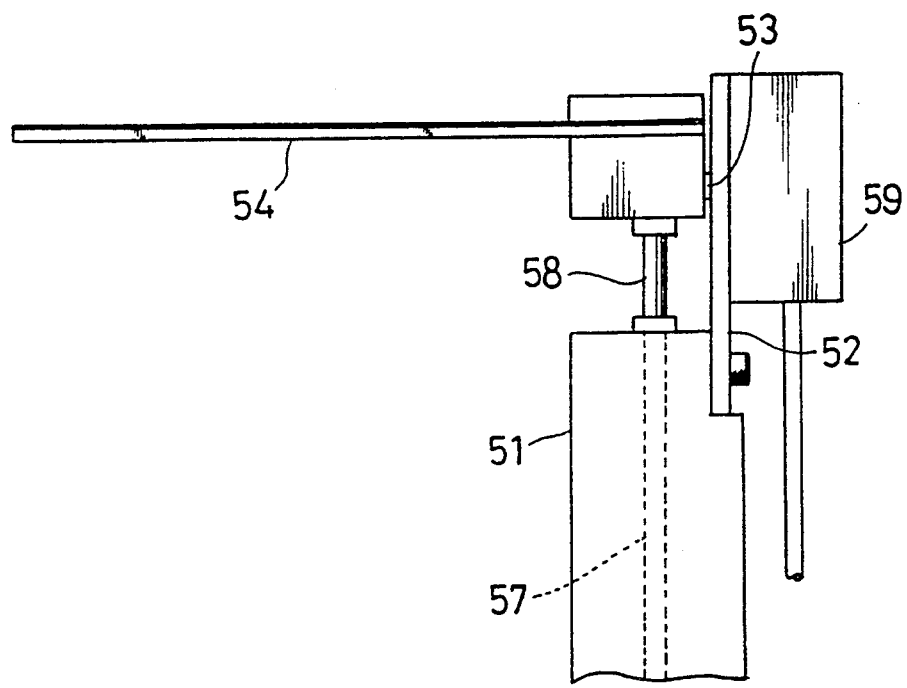
Figure 9:
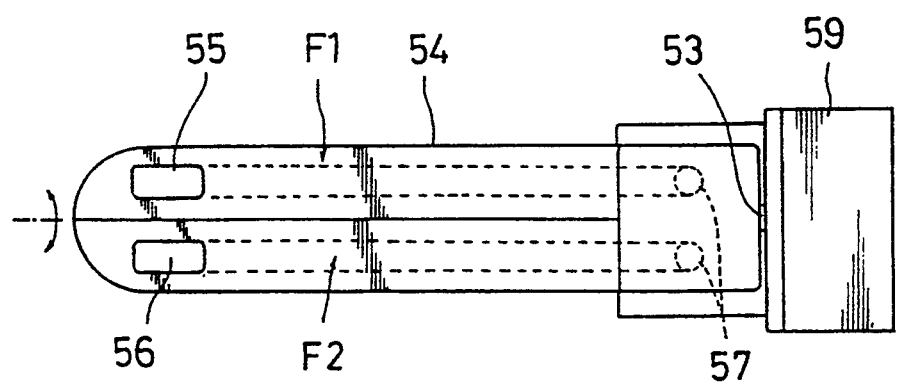
Figure 10A:
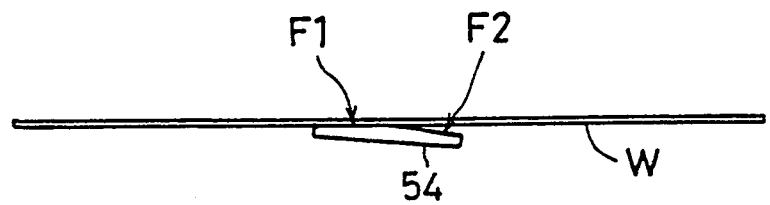
FIGS. 10(a) and (b) are side views of the arm in varied substrate supporting postures.

FIG. 8 is a side view of a principal portion of a second embodiment, FIG. 9 is a plan view thereof, and FIGS. 10(a) and (b) are side views showing wafer supporting modes. A supporting post 51 erected on the movable deck 26 has a bracket 52 attached to an upper end thereof. The bracket 52 has a support shaft 53 rotatable about a horizontal axis extending parallel to the direction of movement of the movable deck 26. A ridged plate-like arm 54 is fixed to the support shaft 53. This plate-like arm 54 has an upper surface defining a first smooth surface F1 and a second smooth surface F2.

The plate-like arm 54 has divided interior spaces lying under the first and second smooth surfaces F1 and F2, respectively. The respective spaces communicate with suction holes 55 and 56 formed in intermediate positions of the first and second smooth surfaces F1 and F2 of the arm 54. Further, these spaces are connected to air ducts 57 formed in the supporting post 51, through flexible tubes 58.

Figure 10B:
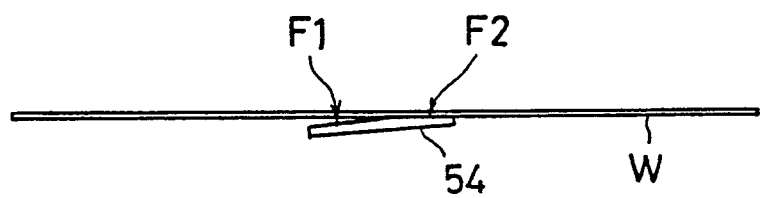

The bracket 52 supports an air actuator 59 operatively connected to the support shaft 53. For fetching a wafer W yet to be cleaned from a cassette C, the support shaft 53 is rotated a predetermined angle to place the first smooth surface F1 in horizontal posture as shown in FIG. 10(a). For depositing a cleaned wafer W in a cassette C, the second smooth surface F2 is placed horizontally as shown in FIG. 10(b). In this way, cleaned wafers W may be transported to and stored in the cassettes c without being recontaminated.

<Third Embodiment>

Figure 11:
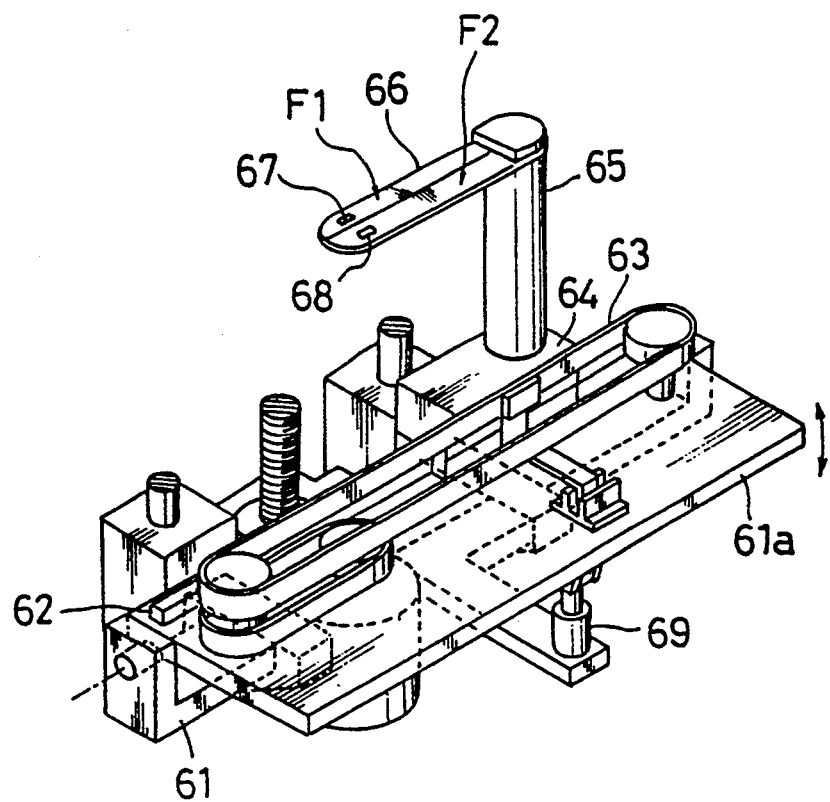

FIG. 11 is a perspective view of a principal portion of a third embodiment. A support block 61 supports a lift deck 61a which in turn supports a movable deck 64 movable by means of a guide 62 and a reversible drive belt 63 toward and away from the cassettes C. The movable deck 64 has a supporting post 65 erected thereon, and a ridged plate-like arm 66 is fixed to an upper end of the supporting post 65. This plate-like arm 66 has an upper surface defining a first smooth surface F1 and a second smooth surface F2.

The plate-like arm 54 has divided interior spaces lying under the first and second smooth surfaces F1 and F2, respectively. The respective spaces communicate with suction holes 67 and 68 formed in intermediate positions of the first and second smooth surfaces F1 and F2 of the arm 66. Further, these spaces are connected to air ducts (not shown) formed in the supporting post 65.

The lift deck 61a is attached to the support block 61 to be pivotable about a horizontal axis extending parallel to the direction of movement of the movable deck 64. An air cylinder 69 is provided between the support block 61 and lift deck 61a. For fetching a wafer W yet to be cleaned from a cassette C, the lift deck 61a is pivoted a predetermined angle to place the first smooth surface F1 in horizontal posture. For depositing a cleaned wafer W in a cassette C, the second smooth surface F2 is placed horizontally. In this way, cleaned wafers W may be transported to and stored in the cassettes C without being recontaminated.

<Fourth Embodiment>

Figure 12:
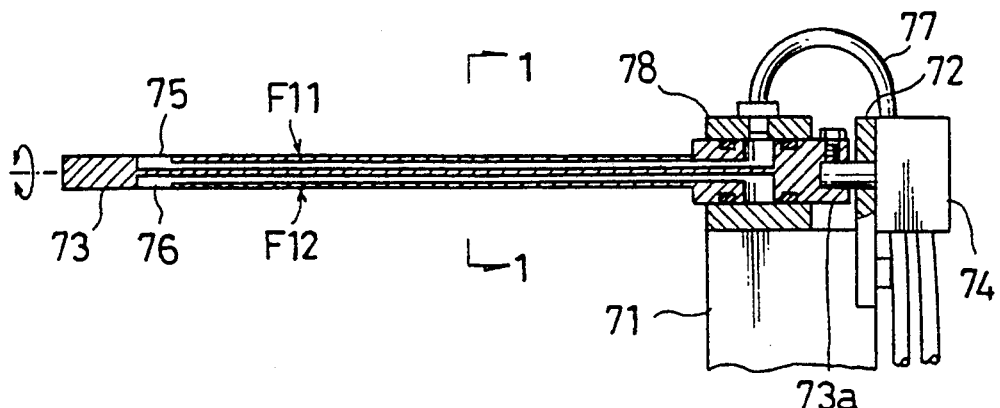
Figure 13:
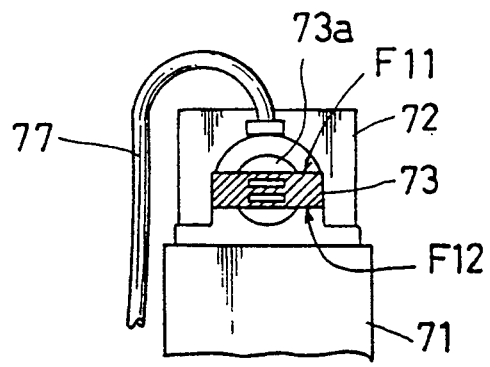

FIG. 12 is a fragmentary side view, partly in section, of a principal portion of a fourth embodiment, and FIG. 13 is a view seen in the direction of arrows 1—1 of FIG. 12. A supporting post 71 has a bracket 72 attached to an upper end thereof. The bracket 72 supports a hollow suction arm 73 rotatable about a horizontal axis extending parallel to the direction of movement of the movable deck. The suction arm 73 has opposite surfaces defining a first and a second smooth surfaces F11 and F12, respectively, and a bottomed tubular shaft 73a forming a proximal portion of the suction arm 73. The tubular shaft 73a is operatively connected to an electric motor 74.

The suction arm 73 has an interior divided at a middle position between the first and second smooth surfaces F11 and F12 to define two interior spaces. The first and second smooth surfaces F11 and F12 include suction holes 75 and 76 formed in longitudinally intermediate positions thereof and communicating with the interior spaces, respectively. These interior spaces extend into the tubular shaft 73a to be selectively connected through an air pipe 77 and a rotary joint 78 to an air duct (not shown) formed in the supporting post 71.

For fetching a wafer W yet to be cleaned from a cassette C with this construction, the first smooth surface F11 is placed upwardly. For depositing a cleaned wafer W in a cassette C, the suction arm 73 is rotated 180 degrees to bring the second smooth surface F12 upwardly. In this way, cleaned wafers W may be transported to and stored in the cassettes C without being recontaminated.

<Fifth Embodiment>

Figure 14:
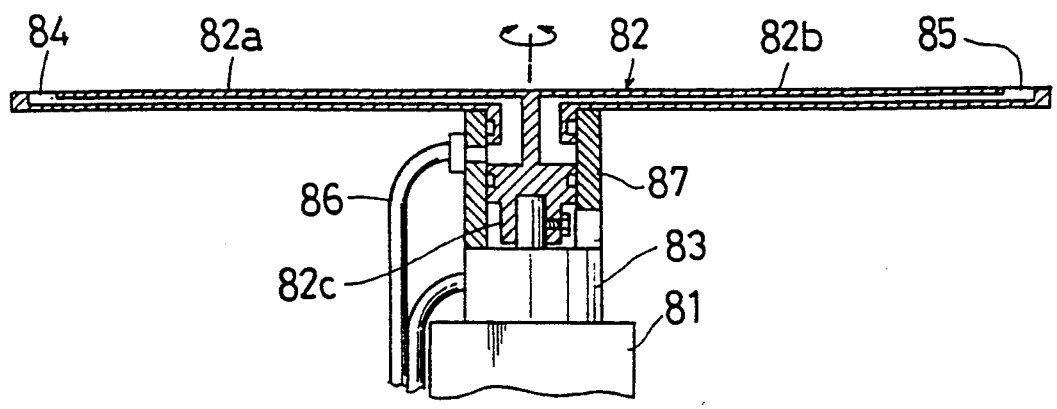

FIG. 14 is a fragmentary side view, partly in section, of a principal portion of a fifth embodiment. A supporting post 81 has a T-shaped suction arm 82 mounted on an upper end thereof to be swivelable about a vertical axis. The suction arm 82 has a smooth upper surface, and is operatively connected to an electric motor 83.

The suction arm 82 includes a first and a second hollow arm portions 82a and 82b, each having a smooth surface, extending in opposite directions from a rotational axis region thereof, and a bottomed tubular shaft portion 82c operatively connected to the electric motor 83. The tubular shaft portion 82c is partitioned at the center into two spaces extending into the first and second arm portions 82a and 82b, respectively. The first and second arm portions 82a and 82b include suction holes 84 and 85 formed in longitudinally intermediate positions of the smooth surfaces and communicating with the two interior spaces, respectively. The interior spaces in the tubular shaft portion 82c are selectively connected through an air pipe 86 and a rotary joint 87 to an air duct (not shown) formed in the supporting post 81.

For fetching a wafer W yet to be cleaned from a cassette C with this construction, the first arm portion 82a is placed in a position opposed to the cassette C. For depositing a cleaned wafer W in a cassette C, the suction arm 82 is swiveled 180 degrees to direct the second arm portion 82b toward the cassette C. In this way, cleaned wafers W may be transported to and stored in the cassettes C without being recontaminated.

<Sixth Embodiment>

Figure 15:
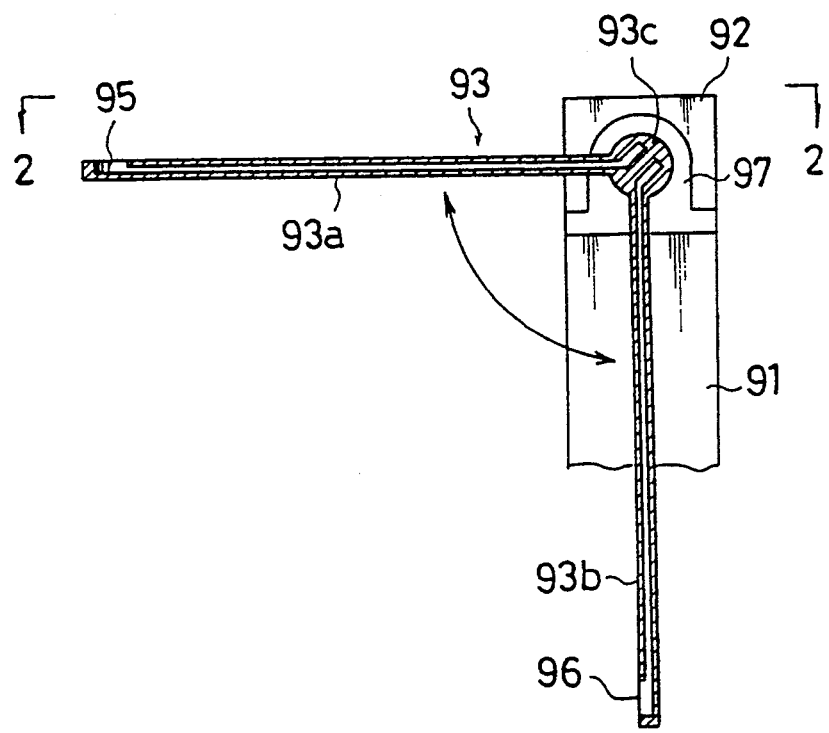
Figure 16:
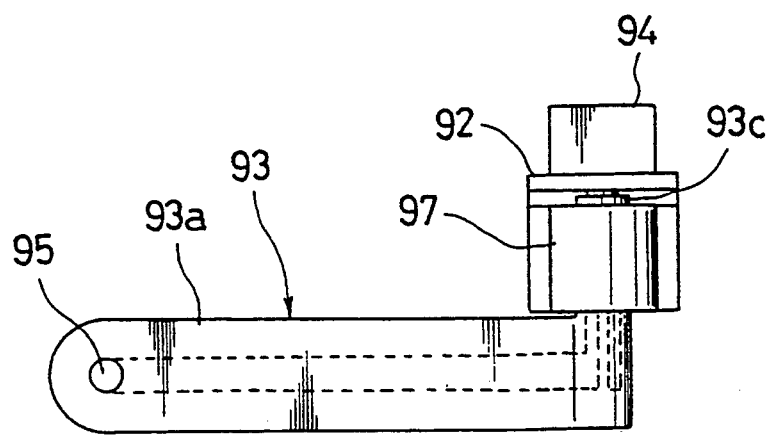

FIG. 15 is a fragmentary side view, partly in section, of a principal portion of a sixth embodiment, and FIG. 16 is a view seen in the direction of arrows 2—2 of FIG. 15. A supporting post 91 has a bracket 92 attached to an upper end thereof. The bracket 92 supports an L-shaped hollow suction arm 93 pivotable about a horizontal axis extending perpendicular to the direction of movement of the movable deck. The suction arm 93 includes a first and a second arm portions 93a and 93b each having a smooth surface, and a bottomed tubular shaft portion 93c operatively connected to an electric motor 94.

The tubular shaft portion 93c is partitioned at the center into two spaces extending into the first and second arm portions 93a and 93b, respectively. The first and second arm portions 93a and 93b include suction holes 95 and 96 formed in longitudinally intermediate positions thereof and communicating with the two interior spaces, respectively. The interior spaces in the tubular shaft portion 93c are selectively connected through a rotary joint 07 to an air duct (not shown) formed in the supporting post 91.

For fetching a wafer W yet to be cleaned from a cassette C with this construction, the first arm portion 93a is placed in a position opposed to the cassette C. For depositing a cleaned wafer W in a cassette C, the suction arm 93 is pivoted 90 degrees to direct the second arm portion 93b toward the cassette C. In this way, cleaned wafers W may be transported to and stored in the cassettes C without being recontaminated.

<Seventh Embodiment>

Figure 17:
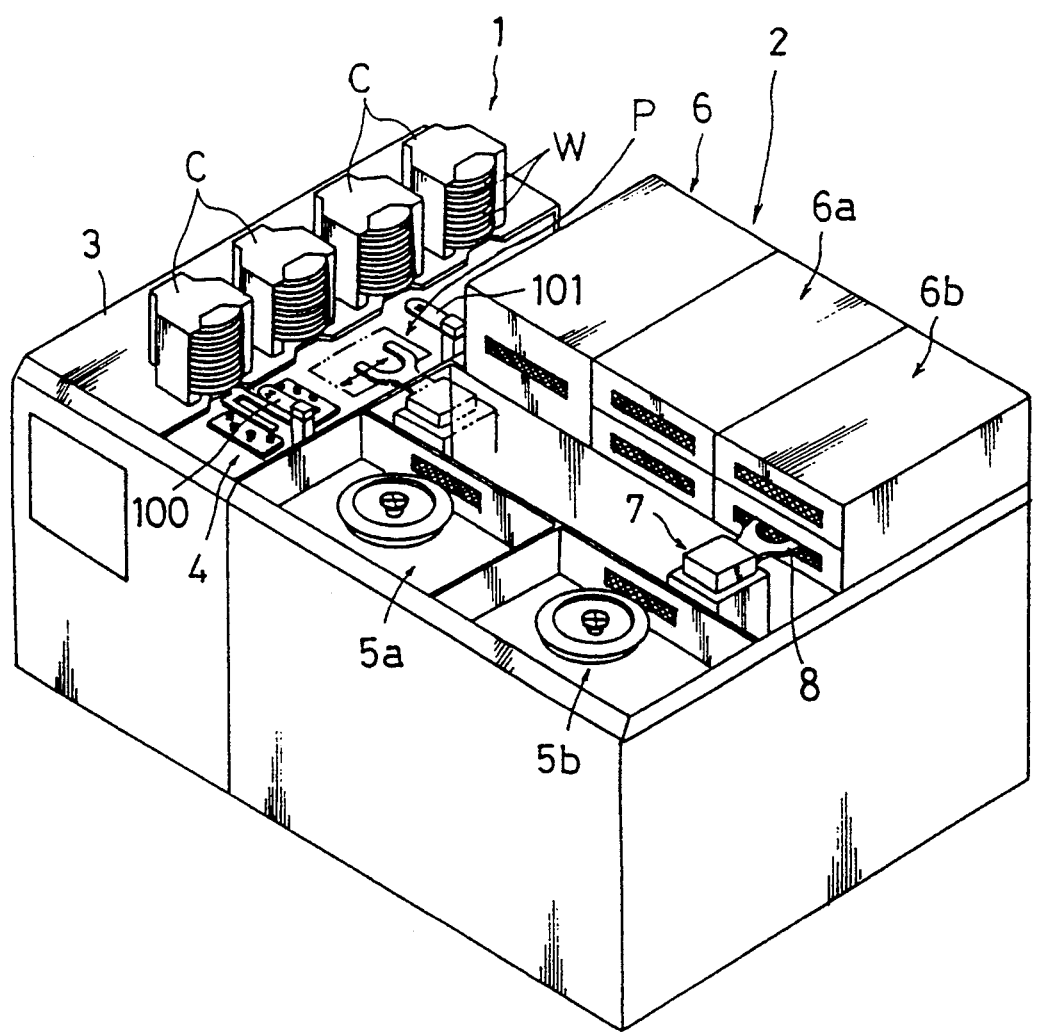

FIG. 17 is a perspective view showing an outline of a wafer cleaning machine employing a wafer transport apparatus in a seventh embodiment. In the first embodiment, the wafer fetch arm 32 and wafer deposit arm 33 are both supported on the same movable deck 26. The seventh embodiment employs an additional transport device including the movable deck 26 as in the first embodiment, and the components (e.g. the support deck 9, support block 16 and so on) to which the movable deck 26 is assembled for support. The wafer fetch arm 32 is mounted on the first movable deck to constitute a wafer fetching transport device 100 for fetching wafers from the cassettes C. The wafer deposit arm 33 is mounted on the second movable deck to constitute a wafer depositing transport device 101. Thus, separate transport devices are provided for fetching the wafers and for depositing the wafers.

The present invention may be further modified as follows:

(1) In the first embodiment, four cassettes C are arranged on the stationary base 3. The number of cassettes C may be one, two, three, five or more.

(2) In the first embodiment, the cassettes C are arranged on the stationary base 3, and the movable deck 26 is supported on the lift deck 16a for vertical movement to fetch a selected one of the wafers stored in multiple vertical stages in each cassette C. However, the cassettes C may be adapted vertically movable instead of the movable deck 26.

(3) The objects to be transported are not limited to semiconductor substrates as in the described embodiments, but may be various other substrates such as glass substrates for liquid crystal displays.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate transport apparatus comprising:
   means for storing a plurality of substrates;
   means for cleaning said substrates;
   means for taking out said substrates from said storing means and for transporting said substrates to said cleaning means while supporting said substrates by vacuum suction;
   means for transporting said substrates cleaned by said cleaning means from said cleaning means to said storing means while supporting said substrates by vacuum suction and for placing said substrates in said storing means; and
   a first movable member and a second movable member movable between said storing means and said cleaning means,
   wherein said taking-out and transporting means is mounted on said first movable member, and said transporting and placing means is mounted on said second movable member.

2. A substrate transport apparatus comprising:
   means for storing a plurality of substrates;
   means for cleaning said substrates;
   a movable member movable between said storing means and said cleaning means;
   a taking-out and transporting mechanism, mounted on said movable member, for taking out said substrates from a cassette of said storing means and for transporting said substrates to said cleaning means while supporting said substrates; and
   a transporting and placing mechanism, mounted on said movable member, for transporting said substrates cleaned by said cleaning means from said cleaning means to said cassette of said storing means while supporting said substrates and for placing said substrates in said storing means.

3. A substrate transport apparatus comprising:
   means for storing a plurality of substrates;
   means for cleaning said substrates;
   a movable member movable between said storing means and said cleaning means;
   a taking-out and transporting mechanism, mounted on said movable member, for taking out said substrates from said storing means and for transporting said substrates to said cleaning means while supporting said substrates by vacuum suction; and a transporting and placing mechanism mounted on said movable member, for transporting said substrates cleaned by said cleaning means from said cleaning means to said storing means while supporting said substrates by vacuum suction and for placing said substrates in said storing means;
   said taking-out and transporting mechanism comprising a first surface having a suction hole; and
   said transporting and placing mechanism comprising a second surface having a suction hole.

4. A substrate transport apparatus as defined in claim 3, further comprising means for enabling said first surface and said second surface.

5. A substrate transport apparatus as defined in claim 4,
   wherein said enabling means comprises:

a supporting shaft provided to said movable member, and having a horizontal axis; and a supporting arm provided to said supporting shaft, and adapted to be rotatable about said horizontal axis;

said first surface and said second surface being so formed on said supporting arm as to define prescribed angles with each other.

6. A substrate transport apparatus as defined in claim 4, wherein said enabling means comprises:

a lift member for supporting said movable member to be pivotable about a horizontal axis; and a supporting arm provided to said movable member;

said first surface and said second surface being so formed on said supporting arm as to define prescribed angles with each other.

7. A substrate transport apparatus as defined in claim 4, wherein said enabling means comprises:

a supporting shaft provided to said movable member, and having a horizontal axis; and a plate-like suction arm provided to said supporting shaft, having front surface and rear surface, and adapted to be rotatable about said horizontal axis;

said first surface and said second surface being formed on said front surface and said rear surface, respectively.

8. A substrate transport apparatus as defined in claim 4, wherein said enabling means comprises:

a vertical shaft provided to said movable member and having a vertical axis; and arm means provided to said vertical shaft and adapted to be rotatable about said vertical axis;

said first surface and said second surface being formed on said arm means, and extending perpendicularly to said vertical axis.

9. A substrate transport apparatus as defined in claim 8, wherein said first surface and said second surface extend in a plane perpendicular to said vertical axis.

10. A substrate transport apparatus as defined in claim 9, wherein said arm means is T-shaped.

11. A substrate transport apparatus as defined in claim 4, wherein said enabling means comprises:

a horizontal shaft provided to said movable member and having a horizontal axis; and a first arm provided to said horizontal shaft, having said first surface, and adapted to be rotatable about said horizontal axis; and a second arm provided to said horizontal shaft, having said second surface, and adapted to be rotatable about said horizontal axis;

said first arm and said second arm extending perpendicularly to said horizontal axis.

12. A substrate transport apparatus as defined in claim 11, wherein said first arm and said second arm are movable in a plane perpendicular to said horizontal axis.

13. A substrate transport apparatus as defined in claim 12, wherein said first arm and said second arm are L-shaped.

14. A substrate transport apparatus as defined in claim 4, wherein said enabling means comprises:

a first arm provided to said movable member and having said first surface;

a second arm provided to said movable member and having said second surface; and a driving mechanism for driving at least one of said first arm and said second arm to move vertically relative to each other.

15. A substrate transport apparatus comprising:

means for storing a plurality of substrates;

means for cleaning said substrates;

a movable member movable between said storing means and said cleaning means;

a taking-out and transporting arm, mounted on said movable member and comprising a first surface having a suction hole, for taking out said substrates from said storing means and for transporting said substrates to said cleaning means while supporting said substrates by vacuum suction;

a transporting and placing arm, mounted on said movable member and comprising a second surface having a suction hole, for transporting said substrates cleaned by said cleaning means from said cleaning means to said storing means while supporting said substrates by vacuum suction and for placing said substrates in said storing means; and a driving mechanism for driving at least one of said taking-out and transporting arm and said transporting and placing arm to move vertically relative to each other.

16. A substrate transport apparatus as defined in claim 15, wherein said driving mechanism moves said transporting and placing arm vertically relative to said taking-out and transporting arm.

17. A substrate transport apparatus as defined in claim 3, wherein said taking-out and transporting mechanism is movable into and out of the substrate storage means for taking out the substrates, and the transporting and placing mechanism is movable into and out of the substrate storage means for depositing the substrates.

18. A substrate transport apparatus as defined in claim 15, wherein said taking-out and transporting arm is movable into and out of the substrate storage means for taking out the substrates, and the transporting and placing arm is movable into and out of the substrate storage means for depositing the substrates.

* * * * *